(12) United States Patent
Takashima

(10) Patent No.: US 11,303,274 B1
(45) Date of Patent: Apr. 12, 2022

(54) SUB-THRESHOLD CURRENT REDUCTION CIRCUIT SWITCHES AND RELATED APPARATUSES AND METHODS

(71) Applicant: Micron Technology, Inc., Boise, ID (US)

(72) Inventor: Go Takashima, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/099,189

(22) Filed: Nov. 16, 2020

(51) Int. Cl.
*H03K 17/687* (2006.01)
*G05F 1/56* (2006.01)
*H03K 19/20* (2006.01)

(52) U.S. Cl.
CPC ........... *H03K 17/6871* (2013.01); *G05F 1/56* (2013.01); *H03K 19/20* (2013.01)

(58) Field of Classification Search
USPC .......................................................... 327/544
See application file for complete search history.

(56) References Cited

U.S. PATENT DOCUMENTS

| | | | | |
|---|---|---|---|---|
| 5,583,457 | A * | 12/1996 | Horiguchi | G06F 1/3203 326/121 |
| 5,724,297 | A * | 3/1998 | Noda | G11C 5/14 365/226 |
| 5,781,062 | A * | 7/1998 | Mashiko | G11C 5/14 327/544 |
| 6,208,171 | B1 * | 3/2001 | Kumagai | H03K 19/0016 326/121 |
| 6,765,429 | B2 * | 7/2004 | Miyagi | H03K 19/0016 327/534 |
| 7,616,051 | B2 * | 11/2009 | Veendrick | H03K 19/0019 326/34 |
| 2007/0168899 | A1 * | 7/2007 | Frenkil | G06F 30/39 257/773 |
| 2020/0328732 | A1 * | 10/2020 | Tasaki | H03K 5/14 |

* cited by examiner

*Primary Examiner* — Thomas J. Hiltunen
(74) *Attorney, Agent, or Firm* — TraskBritt

(57) ABSTRACT

Sub-threshold current reduction circuit (SCRC) switches and related apparatuses and methods are disclosed. An apparatus includes a first set of SCRC switches and a second set of SCRC switches electrically connected between power supply lines and power reception lines. The first set of SCRC switches is configured to electrically connect the power supply lines to the power reception lines in the first operational mode and the second operational mode. The second set of SCRC switches is configured to electrically connect the power supply lines to the power reception lines in the first operational mode and electrically isolate the power supply lines from the power reception lines in the second operational mode. Activation of the first set of SCRC switches is staggered in time with activation of the second set of SCRC switches. The second set of SCRC switches is spaced among the first set of SCRC switches.

20 Claims, 10 Drawing Sheets

SUB-THRESHOLD CURRENT REDUCTION CIRCUIT SWITCHES AND RELATED APPARATUSES AND METHODS

TECHNICAL FIELD

This disclosure relates generally to sub-threshold current reduction circuit (SCRC) switches, and mores specifically to sets of SCRC switches, related SCRC switch gate drivers, SCRC switch control signaling, and SCRC switch device layouts.

BACKGROUND

Sub-threshold current reduction circuit (SCRC) switches may be used to reduce sub-threshold leak current in electronic circuits. For example, even when logic circuitry is not activated, a small amount of current may be conducted therethrough. SCRC switches may be included between elements of electronic circuits and power supply lines to reduce the sub-threshold leak current by turning off the SCRC switches when the electronic circuits are not activated, and turning on the SCRC switches when the electronic circuits are activated.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
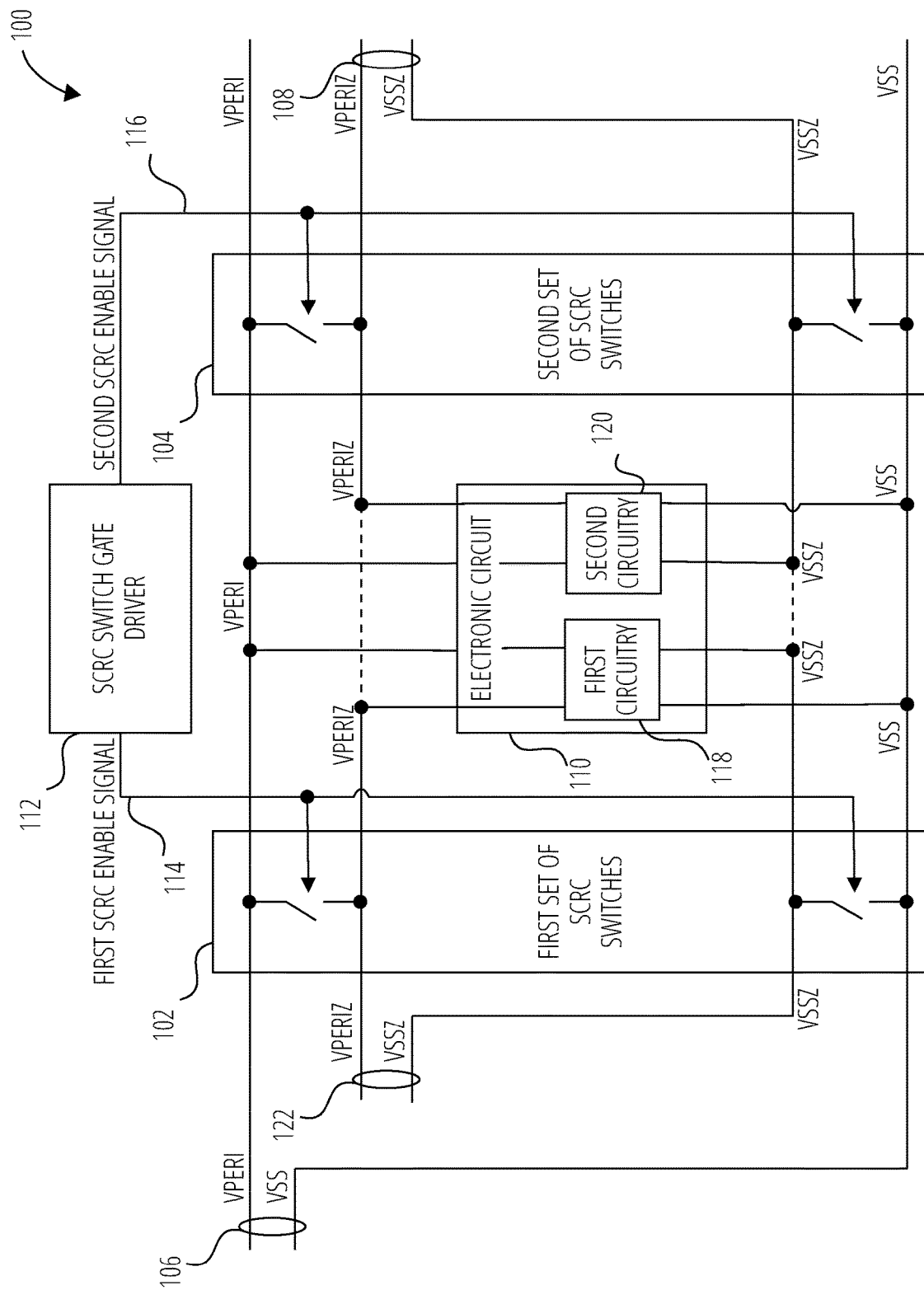
FIG. 1 is a block diagram of an apparatus, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "electrically connected" refers to both direct (i.e., no intervening electrical elements electrically connected in between) and indirect (i.e., one or more intervening elements electrically connected in between) electrical connections.

As used herein, the terms "active material" or "diffusion material" refer to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As use herein, the term "assert," when used with reference to an assertion of a voltage potential or other electrical signal on a gate terminal of a transistor or to control a switch, refers to an application of an appropriate voltage potential or other signal to "turn on" the transistor or switch. For example, a transistor may be "turned on" when the transistor operates in a saturation state wherein a source terminal and a drain terminal of the transistor are electrically connected to each other through the transistor. As another example, a switch in general may be "turned on" when the switch is closed. By extension, the term "de-assert," when used with reference to a de-assertion of a voltage potential or other electrical signal on the gate terminal of the transistor, refers to an application of an appropriate voltage potential to "turn off" the transistor, or in other words cause the transistor to operate in a cutoff state wherein the source terminal and the drain terminal of the transistor are electrically isolated from each other through the transistor.

If substantially all of the SCRC switches of an electronic circuit are controlled together (e.g., turned on together, held in a turned on state together) a relatively large peak power supply current may be consumed when the SCRC switches are turned on. Also, if the electronic circuit operates in different operational modes requiring different amounts of SCRC switches (e.g., a high-speed operational mode and a low-speed operational mode), a larger quantity of SCRC switches than is needed may be used during some of the different operational modes, resulting in consumption of more power supply current than would be consumed if only the needed quantity of SCRC switches were used.

A total width of SCRC switches used in an electronic circuit may be selected to accommodate a highest speed of operation of the electronic circuit. A resistance of the SCRC switches may be proportional to the total width of the SCRC switches. Since propagation delay (tPD) decreases as resistance decreases, the total width of the SCRC switches should be selected to provide a propagation delay tPD that can accommodate a highest speed of operation 502 of the electronic circuit.

By way of non-limiting example, a memory device may be configured to operate in its normal operational mode and in a test mode. The memory device may operate in the test mode at a lower speed of operation than that of the normal operational mode. If all the SCRC switches of the memory device are turned on together for the test mode a large peak in the power supply current may occur at the point in time when the SCRC switches are turned on. Also, the steady state current expended to maintain all the SCRC switches open during the test mode may be relatively large, even though all of the SCRC switches being maintained open during the test mode is excessive.

As another non-limiting example, a memory device may be configured to operate in a 4.3 gigahertz (hereinafter "G" refers to gigahertz) speed mode, a 3.2 G speed mode, and a 1.6 G speed mode. Although the SCRC switches for the memory device are selected to enable operation during the 4.3 G speed mode, there are situations when the memory device operates in the 3.2 G speed mode and in the 1.6 G speed mode. Specifically, the width selected for the SCRC switches is sufficiently large to accommodate operation in the 4.3 G speed mode. During lower operational speed modes (e.g., 3.2 G speed mode, 1.6 G speed mode), the width of the SCRC switches is excessive, which results in excessive power supply current expenditure.

Embodiments disclosed herein reduce the amount of current used to maintain SCRC switches open by operating different sets of SCRC switches of an electronic circuit separately. During operational modes where not all of the electronic circuit is used or when the electronic circuit operates at reduced speeds, only a portion of the SCRC switches may be activated. As a result, in these operational modes where only a portion of the SCRC switches are activated the steady state power supply current expended to maintain only a portion of the SCRC switches activated is less than that resulting from maintaining all the SCRC switches activated. As a result, embodiments disclosed herein may related to electrically controlling a total width of the SCRC switches by selectively activating and deactivating different sets of SCRC switches of an electronic circuit. Also, even when transitioning to an operational state where all the SCRC switches are activated, staggering in time activation of a portion of the SCRC switches with activation of others of the SCRC switches may reduce the peak power supply current.

In some embodiments an apparatus includes a first set of SCRC switches, a second set of SCRC switches, and an SCRC switch gate driver. The first set of SCRC switches is electrically connected between power supply lines and power reception lines of an electronic circuit. The electronic circuit is configured to operate in a first operational mode and a second operational mode. A first speed of operation associated with the first operational mode is faster than a second speed of operation associated with the second operational mode. The second set of SCRC switches is electrically connected between the power supply lines and the power reception lines of the electronic circuit. The SCRC switch gate driver is configured to control the first set of SCRC switches to electrically connect the power supply lines to the power reception lines through the first set of SCRC switches responsive to the first operational mode and the second operational mode. The SCRC switch gate driver is also configured to control the second set of SCRC switches to electrically connect the power supply lines to the power reception lines through the second set of SCRC switches responsive to the first operational mode. The SCRC switch gate driver is further configured to control the second set of SCRC switches to electrically isolate the power supply lines from the power reception lines through the second set of SCRC switches responsive to the second operational mode.

In some embodiments an apparatus includes an electronic circuit, a first set of SCRC switches, a second set of SCRC switches, and an SCRC switch gate driver. The electronic circuit includes a first set of power reception lines and a second set of power reception lines. The first set of SCRC switches is electrically connected between power supply lines and the first set of power reception lines. The second set of SCRC switches is electrically connected between the power supply lines and the second set of power reception lines. The SCRC switch gate driver is configured to provide a first SCRC enable signal to the first set of SCRC switches and a second SCRC enable signal to the second set of SCRC switches. The SCRC switch gate driver is further configured to control the first set of SCRC switches to electrically connect the power supply lines to the first set of power reception lines responsive to an assertion of the first SCRC enable signal, and control the second set of SCRC switches to electrically connect the power supply lines to the second set of power reception lines responsive to an assertion of the second SCRC enable signal.

In some embodiments a method of operating an electronic circuit includes activating a first set of SCRC switches to provide power to first circuitry of the electronic circuit at a first time, and activating a second set of SCRC switches to provide power to second circuitry of the electronic circuit at a second time that is different from the first time.

In some embodiments a method of operating a memory device includes detecting an assertion of a clock enable signal, asserting a first sub-threshold current reduction circuit (SCRC) enable signal responsive to the assertion of the clock enable signal, providing power to first circuitry of the memory device responsive to asserting the first SCRC enable signal. The method also includes detecting a memory command, asserting a second SCRC enable signal responsive to the memory command, and providing power to second circuitry of the memory device responsive to asserting the second SCRC enable signal.

Where different sets of SCRC switches are separately controlled, it may be advantageous to space the different sets of SCRC switches among each other. For example, where a first set of SCRC switches and a second set of SCRC switches are controlled separately from each other, the second set of SCRC switches may be spaced among the first set of SCRC switches. As a result, relatively even distribution of power may be provided to the electronic circuit even if the second set of SCRC switches is turned off (e.g., in a low-speed operational mode such as a test mode). The first set of SCRC switches, which may remain activated even during operational modes when the second set of SCRC switches is deactivated, may be positioned closer to power lines than the second set of SCRC switches. By way of non-limiting example, active materials of the first set of SCRC switches may be positioned between the power lines and active materials of the second set of SCRC switches.

In some embodiments an apparatus includes an electronic circuit, a first set of SCRC switches, and a second set of SCRC switches. The electronic circuit includes first circuitry and second circuitry. The first set of SCRC switches are at one or more SCRC regions of an integrated circuit device including the electronic circuit. The first set of SCRC switches is configured to provide power to the first circuitry. The second set of SCRC switches is spaced among the first set of SCRC switches at the one or more SCRC regions. The second set of SCRC switches is configured to provide power to the second circuitry.

In some embodiments an apparatus includes power supply lines, power reception lines, a first set of SCRC switches, and a second set of SCRC switches. The first set of SCRC switches is electrically connected between the power supply lines and the power reception lines. The second set of SCRC switches is electrically connected between the power supply lines and the power reception lines. The second set of SCRC switches is spaced among the first set of SCRC switches.

In some embodiments a method of operating an electronic circuit includes operating a first set of SCRC switches in a conductive state during a first operational mode of the electronic circuit to provide power to the electronic circuit through the first set of SCRC switches. The method also includes operating a second set of SCRC switches spaced among the first set of SCRC switches in a conductive state during the first operational mode to provide the power to the electronic circuit through the second set of SCRC switches. The method further includes operating the first set of SCRC switches in the conductive state during a second operational mode of the electronic circuit to provide the power to the electronic circuit through the first set of SCRC switches. The method also includes operating the second set of SCRC switches in an insulating state during the second operational mode to electrically isolate the electronic circuit from the power through the second set of SCRC switches.

FIG. 1 is a block diagram of an apparatus 100, according to some embodiments. The apparatus 100 includes power supply lines 106 (e.g., VPERI and VSS in FIG. 1), an electronic circuit 110, power reception lines (e.g., a first set of power reception lines 122 and a second set of power reception lines 108) (e.g., VPERIZ and VSSZ if FIG. 1), a first set of SCRC switches 102, a second set of SCRC switches 104, and an SCRC switch gate driver 112. The first set of SCRC switches 102 is electrically connected between the power supply lines 106 and the first set of power reception lines 122. The second set of SCRC switches 104 is electrically connected between the power supply lines 106 and the second set of power reception lines 108. In some embodiments the first set of power reception lines 122 may optionally be electrically connected to the second set of power reception lines 108 (broken lines shown connecting the first set of power reception lines 122 to the second set of power reception lines 108).

The SCRC switch gate driver 112 is configured to provide a first SCRC enable signal 114 to the first set of SCRC switches 102 and a second SCRC enable signal 116 to the second set of SCRC switches 104. An assertion of the first SCRC enable signal 114 may trigger the first set of SCRC switches 102 to conduct, electrically connecting the power supply lines 106 to the first set of power reception lines 122. A de-assertion of the first SCRC enable signal 114 may deactivate the first set of SCRC switches 102 from conducting, electrically isolating the power supply lines 106 from the first set of power reception lines 122. Stated another way, the SCRC switch gate driver 112 may be configured to control the first set of SCRC switches 102 to electrically connect the power supply lines 106 to the first set of power reception lines 122 responsive to an assertion of the first SCRC enable signal 114.

Likewise, an assertion of the second SCRC enable signal 116 may trigger the second set of SCRC switches 104 to conduct, electrically connecting the power supply lines 106 to the second set of power reception lines 108. A de-assertion of the second SCRC enable signal 116 may deactivate the second set of SCRC switches 104 from conducting, electrically isolating the power supply lines 106 from the second set of power reception lines 108. Stated another way, the SCRC switch gate driver 112 may be configured to control the second set of SCRC switches 104 to electrically connect the power supply lines 106 to the second set of power reception lines 108 responsive to an assertion of the second SCRC enable signal 116.

In some embodiments the electronic circuit 110 is configured to operate in a first operational mode and a second operational mode. A first speed of operation associated with the first operational mode may be faster than a second speed of operation associated with the second operational mode. By way of non-limiting example, the electronic circuit 110 may include circuitry for a memory device, and the first operational mode may include a normal operational mode and the second operational mode may include a test mode (e.g., a self-test mode). Also by way of non-limiting example, the electronic circuit 110 may include circuitry for a memory device configured to operate in multiple operational modes corresponding to multiple different operational speeds (e.g., 4.3 G, 3.2 G, 1.6 G). In such embodiments the SCRC switch gate driver 112 may be configured to control the first set of SCRC switches 102 to electrically connect the power supply lines 106 to the power reception lines (e.g., the first set of power reception lines 122) through the first set of SCRC switches 102 responsive to the first operational mode and the second operational mode. The SCRC switch gate driver 112 may also be configured to control the second set of SCRC switches 104 to electrically connect the power supply lines 106 to the power reception lines (e.g., the second set of power reception lines 108) through the second set of SCRC switches 104 responsive to the first operational mode. The SCRC switch gate driver 112 may further be configured to control the second set of SCRC switches 104 to electrically isolate the power supply lines 106 from the power reception lines (e.g., the second set of power reception lines 108) through the second set of SCRC switches 104 responsive to the second operational mode.

In some embodiments the electronic circuit 110 includes first circuitry 118 and second circuitry 120. In some such embodiments the first circuitry 118 may be electrically connected to power reception lines (e.g., the first set of power reception lines 122) that are electrically isolated from power reception lines (e.g., the second set of power reception lines 108) that are electrically connected to the second circuitry 120. In such embodiments the SCRC switch gate driver 112 may be configured to separately power the first circuitry 118 and the second circuitry 120. By way of non-limiting example, the electronic circuit 110 may include circuitry for a memory device, the second circuitry 120 may include circuitry that is only activated during memory access operations (e.g., read, write, erase, etc.), and the first circuitry 118 includes other circuitry that is activated even when the memory access operations are not occurring. The SCRC switch gate driver 112 may be configured to assert the first SCRC enable signal 114 responsive to assertion of a clock enable signal, and to assert the second set of SCRC switches 104 responsive to a memory access command (e.g., an activate (ACT) command, a mode register read (MRR) command, a multi-purpose command (MPC), etc.) In this way the relatively larger power supply current associated with maintaining both the first set of SCRC switches 102 and the second set of SCRC switches 104 in conductive states will only be used when needed (i.e., when both the first circuitry 118 and the second circuitry 120 are activated), and assertions of the first SCRC enable signal 114 and the second SCRC enable signal 116 may be staggered in time to reduce the peak power supply current.

Figure 2:
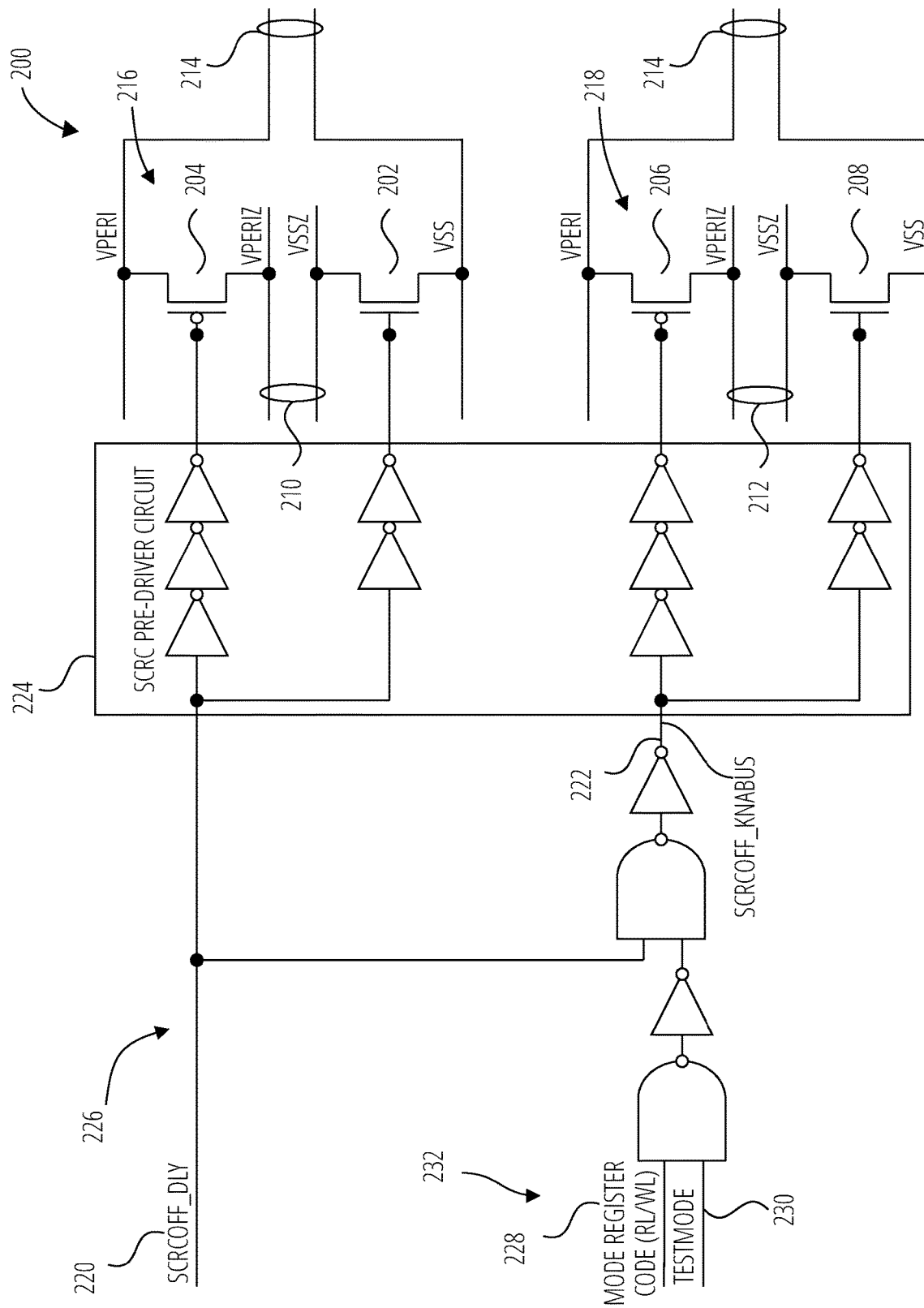
FIG. 2 is a circuit schematic illustration of SCRC circuitry, according to some embodiments.

FIG. 2 is a circuit schematic illustration of SCRC circuitry 200, according to some embodiments. The SCRC circuitry 200 includes an SCRC switch gate driver 226, an SCRC pre-driver circuit 224, a first set of SCRC switches 216, and a second set of SCRC switches 218. The SCRC switch gate driver 226, the first set of SCRC switches 216, and the second set of SCRC switches 218 may be similar to the SCRC switch gate driver 112, the first set of SCRC switches 102, and the second set of SCRC switches 104 discussed above with reference to FIG. 1.

For example, the SCRC switch gate driver 226 may be configured to provide a first SCRC enable signal 220 (e.g., SCROFF_DLY in FIG. 2) configured to control operation of the first set of SCRC switches 216 and a second SCRC enable signal 222 (e.g., SCROFF_KNABUS in FIG. 2) configured to control operation of the second set of SCRC switches 218. The SCRC pre-driver circuit 224 is configured to drive the first SCRC enable signal 220 and the second SCRC enable signal 222 provided by the SCRC switch gate driver 226. Also, the first set of SCRC switches 216 is electrically connected between power supply lines 214 (e.g., VPERI and VSS in FIG. 2) and a first set of power reception lines 210 (e.g., VPERIZ and VSSZ in FIG. 2). Responsive to an assertion (e.g., a logic level high, or "1," in FIG. 2) of the first SCRC enable signal 220 the first set of SCRC switches 216 is configured to electrically connect the power supply lines 214 to the first set of power reception lines 210. Furthermore, the second set of SCRC switches 218 is electrically connected between the power supply lines 214 and a second set of power reception lines 212 (e.g., VPERIZ and VSSZ in FIG. 2). Responsive to an assertion (e.g., a logic level low, or "0," in FIG. 2) of the second SCRC enable signal 222 the second set of SCRC switches 218 is configured to electrically connect the power supply lines 214 to the second set of power reception lines 212.

The first set of SCRC switches 216 includes a first pull-up SCRC switch 204 electrically connected between a VPERI line of the power supply lines 214 and a VPERIZ line of the first set of power reception lines 210. The first set of SCRC switches 216 also includes a first pull-down SCRC switch 202 electrically connected between a VSS line of the power supply lines 214 and a VSSZ line of the first set of power reception lines 210. Similarly, the second set of SCRC switches 218 includes a second pull-up SCRC switch 206 electrically connected between a VPERI line of the power supply lines 214 and a VPERIZ line of the second set of power reception lines 212. The second set of SCRC switches 218 also includes a second pull-down SCRC switch 208 electrically connected between a VSS line of the power supply lines 214 and a VSSZ line of the second set of power reception lines 212.

The SCRC switch gate driver 226 is configured to receive the first SCRC enable signal 220 and other control inputs 232. In the example illustrated in FIG. 2 the other control inputs 232 include a mode register code signal 228 (e.g., "mode register code (RL/WL)" in FIG. 2) and a TESTMODE signal 230. Responsive to assertions of each of the first SCRC enable signal 220 and the other control inputs 232, the SCRC switch gate driver 226 may be asserted. Accordingly, the second set of SCRC switches 218 may be configured to electrically connect the power supply lines 214 to the second set of power reception lines 212 responsive to assertions of each of the first SCRC enable signal 220 and the other control inputs 232, and electrically isolate the power supply lines 214 from the second set of power reception lines 212 otherwise.

In some embodiments the SCRC circuitry 200 may be for a memory device configured to operate in a normal operational mode and a test mode. A speed of operation of the normal operational mode may be faster than a speed of operation of the test mode. Accordingly, the memory device may only activate the first set of SCRC switches 216 during the test mode, but activate both the first set of SCRC switches 216 and the second set of SCRC switches 218 during the normal operational mode. When the memory device is operating in the normal operational mode the first SCRC enable signal 220 and the other control inputs 232 may be asserted to electrically connect the first set of power reception lines 210 to the power supply lines 214 via the first set of SCRC switches 216 and to electrically connect the second set of power reception lines 212 to the power supply lines 214 via the second set of SCRC switches 218. The memory device may transition from the normal operational mode to the test mode by de-asserting the mode register code signal 228, the TESTMODE signal 230, or both. Responsive to transitioning to the test mode the SCRC switch gate driver 226 may de-assert the second SCRC enable signal 222, electrically isolating the second set of power reception lines 212 from the power supply lines 214 through the second set of SCRC switches 218. In the test mode the first SCRC enable signal 220 may remain asserted to maintain the first set of power reception lines 210 electrically connected to the power supply lines 214 via the first set of SCRC switches 216.

In some embodiments the first set of power reception lines 210 may be electrically connected to the second set of power reception lines 212. In some embodiments the first set of power reception lines 210 may be electrically isolated from the second set of power reception lines 212.

Figure 3:
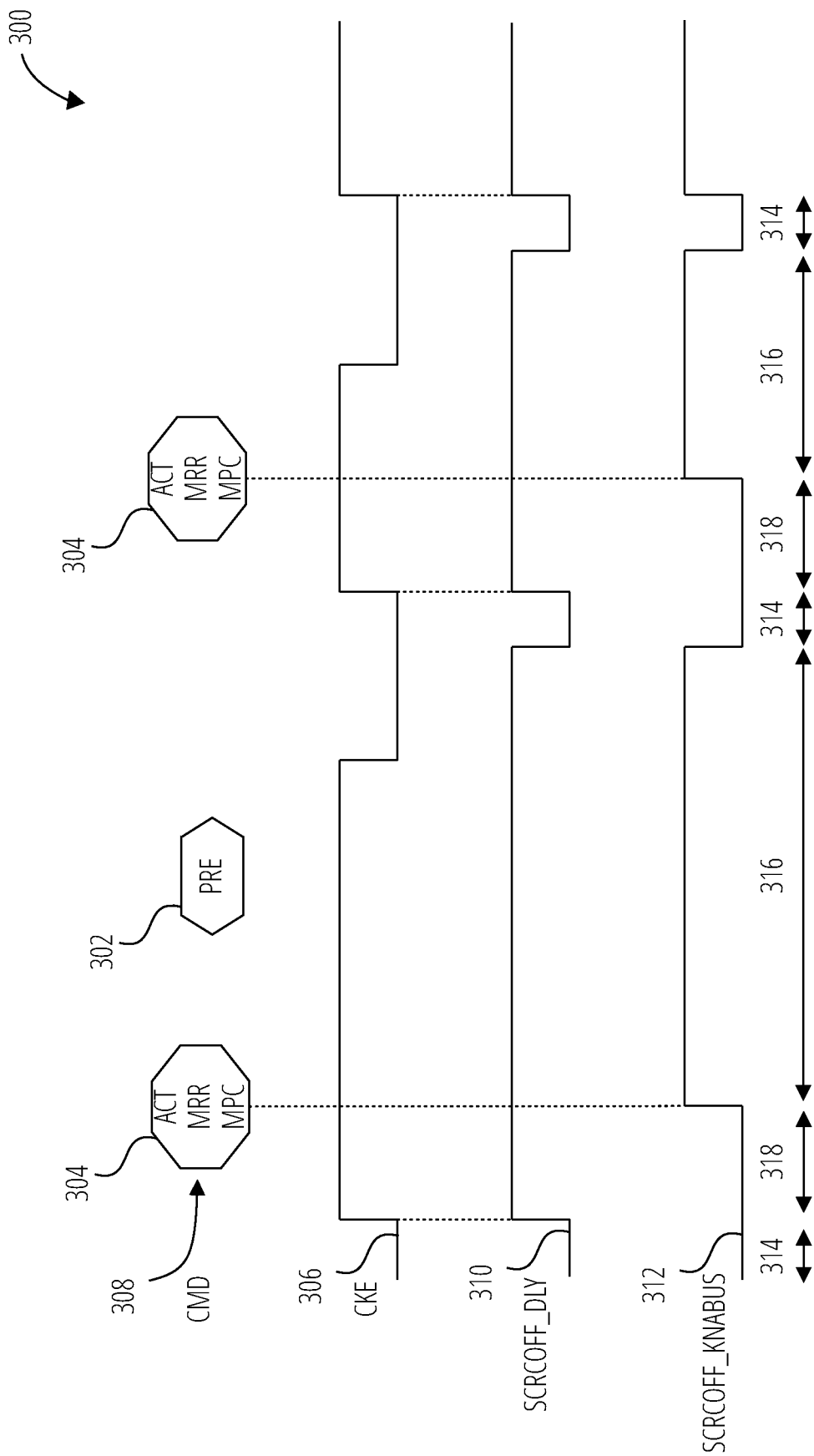
FIG. 3 is a signal timing diagram of signals of a memory device, according to some embodiments.

FIG. 3 is a signal timing diagram 300 of signals of a memory device, according to some embodiments. The signals illustrated in FIG. 3 may be used in the apparatus 100 of FIG. 1, the SCRC circuitry 200 of FIG. 2, or other devices including SCRC switches. The signal timing diagram 300 includes memory commands 308 (e.g., "CMD" in FIG. 3), a clock enable signal 306 (e.g., CKE in FIG. 3), a first SCRC enable signal 310 (e.g., SCRCOFF_DLY in FIG. 3), and a second SCRC enable signal 312 (e.g., SCRCOFF_KNABUS in FIG. 3). By way of non-limiting examples, the first SCRC enable signal 310 and the second SCRC enable signal 312 may be used as the first SCRC enable signal 114 and the second SCRC enable signal 116, respectively, of FIG. 1, or as the first SCRC enable signal 220 and the second SCRC enable signal 222, respectively, of FIG. 2.

The memory commands 308 may include, for example, one or more triggering commands 304, a pre-charge command 302, other commands, and combinations thereof. The pre-charge command 302 (PRE) may be used to deactivate the open row in a particular memory bank or the open row in all memory banks, and the memory bank(s) may be available for a subsequent row activation a specific time (e.g., tRP) after the pre-charge command 302 is issued. By way of non-limiting example, the first pull-up SCRC switch 204 may include an activate command (ACT), which may be used to open or activate a row in a particular memory bank for a subsequent access (e.g., a read, a write, a refresh, an erase, etc.). Also by way of non-limiting example, the one or more triggering commands 304 may include a mode register read (MRR) command, which may be used to read configuration and status data from registers of the memory device. As another non-limiting example, the one or more triggering commands 304 may include a multi-purpose command (MPC), which may be used to issue commands associated with interface initialization, training, and periodic calibration.

In an SCRC off operational mode 314 an SCRC switch gate driver (e.g., the SCRC switch gate driver 112 of FIG. 1, the SCRC switch gate driver 226 of FIG. 2) may maintain the first SCRC enable signal 310 and the second SCRC enable signal 312 de-asserted. As a result, the SCRC switch gate driver may control a first set of SCRC switches (e.g., the first set of SCRC switches 102 of FIG. 1, the first set of SCRC switches 216 of FIG. 2) and a second set of SCRC switches (e.g., the second set of SCRC switches 104 of FIG. 1, the second set of SCRC switches 218 of FIG. 2) to electrically isolate power supply lines (e.g., the power supply lines 106 of FIG. 1, the power supply lines 214 of FIG. 2) from the power reception lines (e.g., the first set of power reception lines 122 and the second set of power reception lines 108 of FIG. 1, the first set of power reception lines 210 and the second set of power reception lines 212 of FIG. 2) through the first set of SCRC switches and the second set of SCRC switches during the SCRC off operational mode 314.

In a first operational mode 316 the SCRC switch gate driver may maintain the first SCRC enable signal 310 and the second SCRC enable signal 312 in an asserted state. As a result, the SCRC switch gate driver may control the first set of SCRC switches and the second set of SCRC switches to electrically connect the power supply lines to the power reception lines during the first operational mode 316.

In a second operational mode 318 the SCRC switch gate driver may maintain the first SCRC enable signal asserted and the second SCRC enable signal de-asserted. As a result, the SCRC switch gate driver may control the first set of SCRC switches to electrically connect the power supply lines to the power reception lines and the second set of SCRC switches to electrically isolate the power supply lines from the power reception lines during the second operational mode 318. In the second operational mode 318 the power supply current drawn by the memory device may be lower than the power supply current drawn by the memory device in the first operational mode 316. Accordingly, the memory device may conserve power during the second operational mode 318.

During at least some transitions from the SCRC off operational mode 314 to the first operational mode 316 the SCRC switch gate driver may be configured to stagger in time a triggering of electrical connection of the power supply lines to the power reception lines through the first set of SCRC switches with a triggering of electrical connection of the power supply lines to the power reception lines through the second set of SCRC switches. In other words, the SCRC switch gate driver may assert the first SCRC enable signal 310 and the second SCRC enable signal 312 at different times, as illustrated in FIG. 3.

The clock enable signal 306 may be configured to enable a clock used to operate the memory device. Activating the clock may activate operation of a portion of the memory device. It may be desirable to provide power to the portion of the memory device activated by the clock enable signal 306. Accordingly, assertion of the first SCRC enable signal 310 may be synchronized with assertion of the clock enable signal 306 (e.g., rising edges of the clock enable signal 306 are at substantially the same times as rising edges of the first SCRC enable signal 310). As illustrated in FIG. 3, however, falling edges of the first SCRC enable signal 310 may be delayed to after falling edges of the clock enable signal 306.

Assertion of the second SCRC enable signal 312 may be offset from assertion of the first SCRC enable signal 310. In some embodiments the second SCRC enable signal 312 may be asserted responsive to the one or more triggering commands 304. In other words, the triggering of the electrical connection of the power supply lines to the power reception lines through the second set of SCRC switches may be responsive to the one or more triggering commands 304. The one or more triggering commands 304 may trigger additional operation of the memory device above that triggered by the clock enable signal 306. As a result, asserting the second SCRC enable signal 312 responsive to the one or more triggering commands 304 may assure that power is provided to enable the additional operation of the memory device responsive to the one or more triggering commands 304.

In some embodiments the memory device includes first circuitry (e.g., the first circuitry 118 of FIG. 1) and second circuitry (e.g., the second circuitry 120 of FIG. 1). The first circuitry may be electrically connected to the first set of power reception lines and the second circuitry may be electrically connected to the second set of power reception lines. Accordingly, an assertion of the first SCRC enable signal 310 may provide power to the first circuitry and an assertion of the second SCRC enable signal 312 may provide power to the second circuitry. In some embodiments the second circuitry includes one or more of global bus (GBUS) driver circuitry, data bus (DBUS) driver circuitry, cache data strobe (CDTS) logic, local bus (LBUS) driver circuitry, and error correction control (ECC) circuitry, as will be discussed in more detail with reference to FIG. 4. The first circuitry may include other circuitry of the memory device. The first circuitry may be active during both the first operational mode 316 and the second operational mode 318. The second circuitry may be inactive during the first operational mode 316 and active during the second operational mode 318. Both the first circuitry and the second circuitry may be inactive during the SCRC off operational mode 314.

Figure 4:
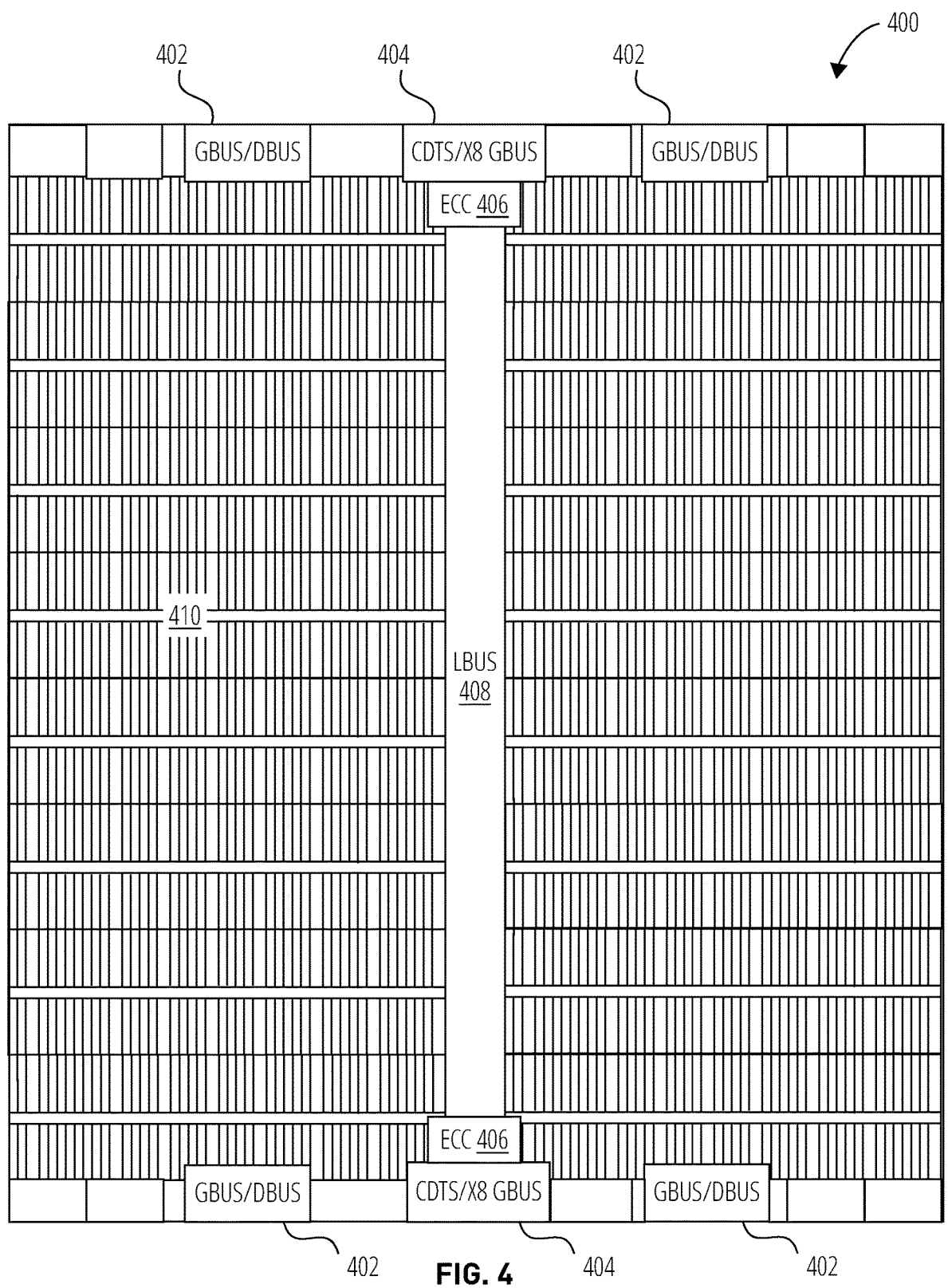
FIG. 4 is a plan view of circuitry for a memory device, according to some embodiments.

FIG. 4 is a plan view of circuitry for a memory device 400, according to some embodiments. Referring to FIG. 3 and FIG. 4 together, the circuitry for a memory device 400 includes global bus and data bus driver circuitry 402, cache data strobe logic and global bus driver circuitry 404, error correction control circuitry 406, local bus driving circuitry 408, and other circuitry 410. The other circuitry 410 may include circuitry that remains activated in the first operational mode 316 and the second operational mode 318. The global bus and data bus driver circuitry 402, the cache data strobe logic and global bus driver circuitry 404, the error correction control circuitry 406, and the local bus driving circuitry 408 may remain active in the second operational mode 318, but inactive in the first operational mode 316.

Figure 5:
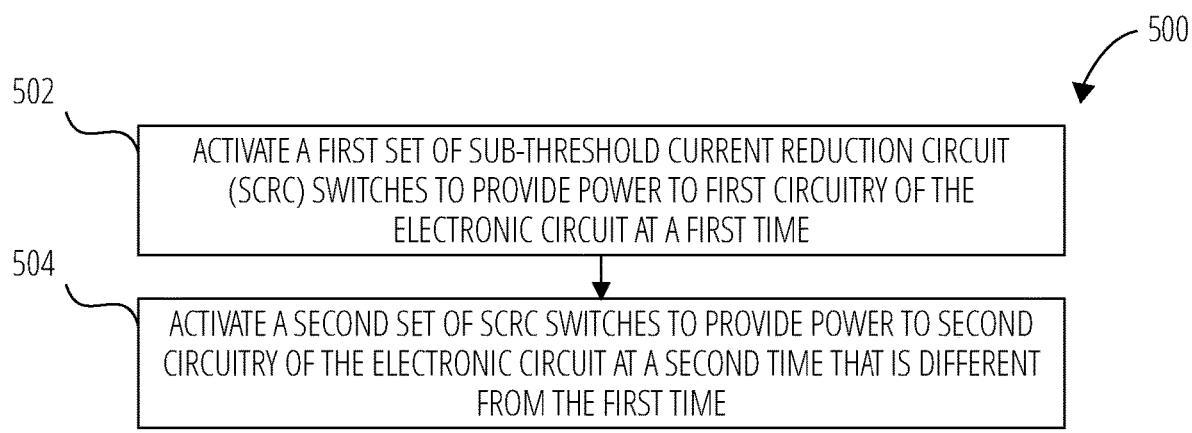
FIG. 5 is a flowchart illustrating a method of operating an electronic circuit, according to some embodiments.

FIG. 5 is a flowchart illustrating a method 500 of operating an electronic circuit (e.g., the electronic circuit 110 of FIG. 1), according to some embodiments. In operation 502 the method 500 includes activating a first set of SCRC switches to provide power to first circuitry of the electronic circuit at a first time. In some embodiments activating the first set of SCRC switches at the first time includes activating the first set of SCRC switches responsive to an assertion of a clock enable signal.

In operation 504 the method 500 includes activating a second set of SCRC switches to provide power to second circuitry of the electronic circuit at a second time that is different from the first time. In some embodiments activating the second set of SCRC switches at the second time includes activating the second set of SCRC switches responsive to a memory command.

Figure 6:
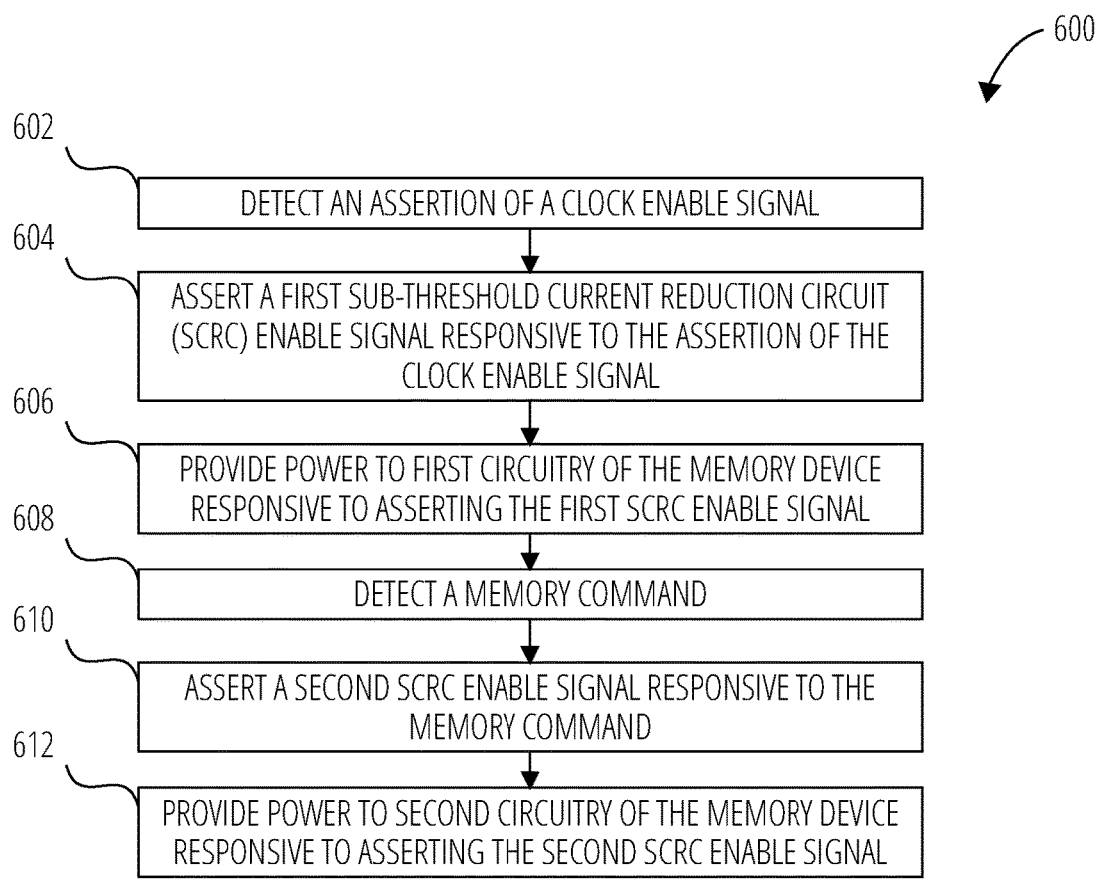
FIG. 6 is a flowchart illustrating a method of operating a memory device, according to some embodiments.

FIG. 6 is a flowchart illustrating a method 600 of operating a memory device, according to some embodiments. In operation 602 the method 600 includes detecting an assertion of a clock enable signal.

In operation 604 the method 600 includes asserting a first SCRC enable signal responsive to the assertion of the clock enable signal.

In operation 606 the method 600 includes providing power to first circuitry of the memory device responsive to asserting the first SCRC enable signal.

In operation 608 the method 600 includes detecting a memory command. In some embodiments detecting the memory command includes detecting one or more of an activate (ACT) command, a mode register read (MRR) command, and a multi-purpose command (MPC).

In operation 610 the method 600 includes asserting a second SCRC enable signal responsive to the memory command.

In operation 612 the method 600 includes providing power to second circuitry of the memory device responsive to asserting the second SCRC enable signal. In some embodiments providing the power to the second circuitry includes providing the power to global bus driver circuitry, data bus driver circuitry, cache data strobe (CDTS) logic, local bus (LBUS) driver circuitry, and error correction control (ECC) circuitry.

Figure 7:
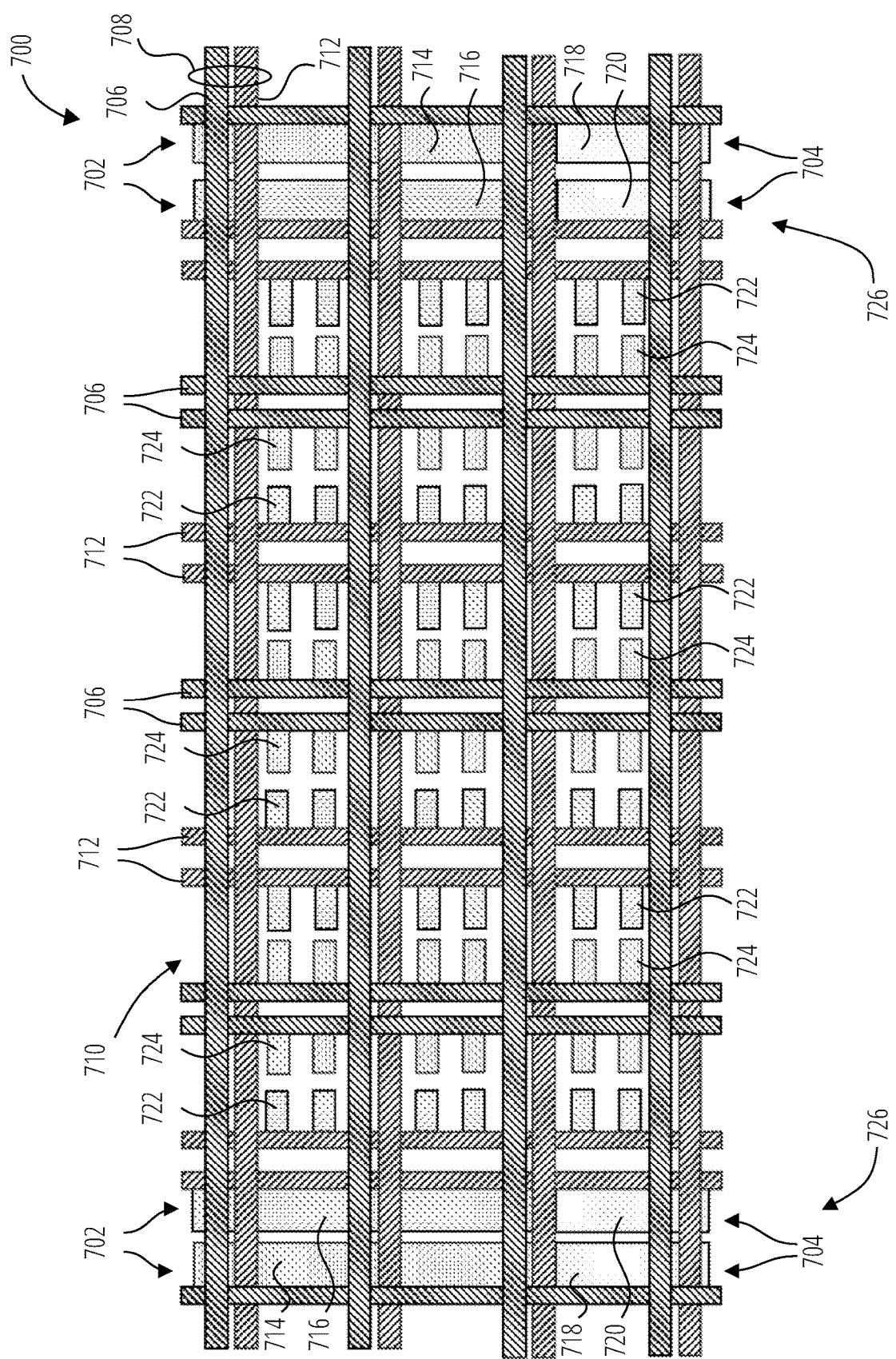
FIG. 7 is a plan view of an apparatus, according to some embodiments.

FIG. 7 is a plan view of an apparatus 700, according to some embodiments. The apparatus 700 may be an example of the apparatus 100 of FIG. 1. By way of non-limiting example, the apparatus 700 may include an integrated circuit device. The apparatus 700 includes a first set of SCRC switches 702, a second set of SCRC switches 704, power reception lines 708, and an electronic circuit 710 similar to the first set of SCRC switches 102, the second set of SCRC switches 104, the power reception lines (e.g., the first set of power reception lines 122 and the second set of power reception lines 108), and the electronic circuit 110 of FIG. 1. The first set of SCRC switches 702 and the second set of SCRC switches 704 include MOSFET transistors at one or more SCRC regions 726 of the apparatus 700. The first set of SCRC switches 702 include first PMOS active materials 714 corresponding to pull-up SCRC switches and first NMOS active materials 716 corresponding to pull-down SCRC switches. The second set of SCRC switches 704 include second PMOS active materials 718 corresponding to pull-up SCRC switches and second NMOS active materials 720 corresponding to pull-down SCRC switches.

The power reception lines 708 include VPERIZ lines 706 (illustrated in FIG. 7 with upward-sloping shading) and VSSZ lines 712 (illustrated in FIG. 7 with downward-sloping shading). The power reception lines 708 form a grid of the power reception lines 708 in the apparatus 700. The first set of SCRC switches 702 and the second set of SCRC switches 704 are electrically connected between power supply lines (not shown) and the power reception lines 708. Accordingly, the first set of SCRC switches 702 and the second set of SCRC switches 704 are configured to selectively electrically connect the power supply lines to the power reception lines 708. Stated another way, the first set of SCRC switches 702 and the second set of SCRC switches 704 are configured to selectively provide power to the power reception lines 708.

The electronic circuit 710 may include logic including MOSFET transistors. FIG. 7 illustrates various active materials (e.g., NMOS active materials 722 and PMOS active materials 724) corresponding to the MOSFET transistors of the electronic circuit 710. By way of non-limiting example, the electronic circuit 710 may include circuitry for a memory device.

In some embodiments the electronic circuit 710 may include first circuitry (not shown) and second circuitry (not shown). In such embodiments the first set of SCRC switches 702 may be configured to provide power to the first circuitry via the power reception lines 708 and the second set of SCRC switches 704 may be configured to provide power to the second circuitry via the power reception lines 708.

In some embodiments the electronic circuit 710 is configured to operate according to a first operational mode and a second operational mode. During the first operational mode the first set of SCRC switches 702 and the second set of SCRC switches 704 may be activated to provide the power to the first circuitry and the second circuitry. During the second operational mode the first set of SCRC switches 702 may be activated to provide the power to the first circuitry and the second set of SCRC switches may be deactivated to isolate the second circuitry from the power. In some embodiments the first operational mode is associated with a first speed of operation of the electronic circuits 710 and the second operational mode is associated with a second speed of operation of the electronic circuits 710. By way of non-limiting example, the first operational mode may include a normal operational mode of a memory device and the second operational mode may include a test mode of the memory device, in which the electronic circuit 710 operates at a slower operational speed than in the normal operational mode.

The first set of SCRC switches 702 and the second set of SCRC switches 704 may be separately controllable. By way of non-limiting example, turning of the second set of SCRC switches 704 during a lower speed mode (e.g., a test mode) may turn off substantially 40% of the SCRC switches. As a result, power supply current may be reduced during the lower-speed mode. For portions of the electronic circuit 710 that are proximate to the second set of SCRC switches 704 when the second set of SCRC switches 704 are turned off, power may be delivered to the portions of the electronic circuit 710 that are proximate to the second set of SCRC switches 704 through the first set of SCRC switches 702. This power may travel a longer distance through the power reception lines 708 than if the power were supplied through the second set of SCRC switches 704. As a result, the resistance of the power reception lines 708 between the power supply lines and the portions of the electronic circuit 710 that are proximate to the second set of SCRC switches 704 is higher when the second set of SCRC switches 704 are turned off than when the second set of SCRC switches 704 are turned on.

Figure 8:
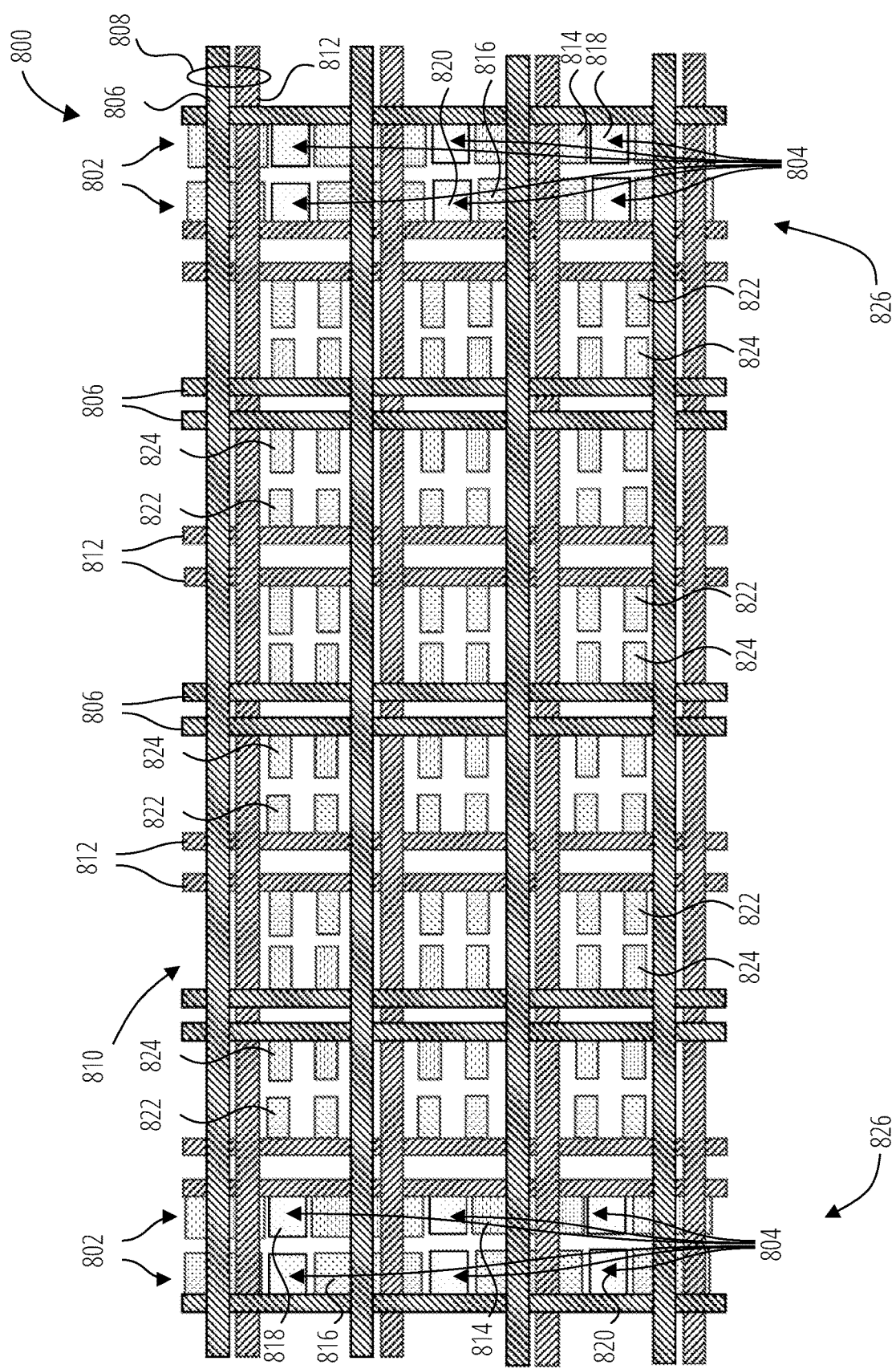
FIG. 8 is a plan view of another apparatus, according to some embodiments.

FIG. 8 is a plan view of another apparatus 800, according to some embodiments. The apparatus 800 is similar to the apparatus 700 of FIG. 7. For example, the apparatus 800 includes a first set of SCRC switches 802, a second set of SCRC switches 804, power reception lines 808, an electronic circuit 810, VPERIZ lines 806, VSSZ lines 812, one or more SCRC regions 826, first PMOS active materials 814, first NMOS active materials 816, second PMOS active materials 818, second NMOS active materials 820, NMOS active materials 822, and PMOS active materials 824 similar to the first set of SCRC switches 702, the second set of SCRC switches 704, the power reception lines 708, the electronic circuit 710, the VPERIZ lines 706, the VSSZ lines 712, the one or more SCRC regions 726, the first PMOS active materials 714, the first NMOS active materials 716, the second PMOS active materials 718, the second NMOS active materials 720, the NMOS active materials 722, and the PMOS active materials 724 of FIG. 7.

In contrast to the apparatus 700, which positioned the second set of SCRC switches 704 together substantially separate from the first set of SCRC switches 702, the second set of SCRC switches 804 of the apparatus 800 are spaced among the first set of SCRC switches 802 at the one or more SCRC regions 826. In the example illustrated in FIG. 8 the active materials (e.g., the first PMOS active materials 814 and the first NMOS active materials 816) of the first set of SCRC switches 802 are positioned between the power reception lines 808 and the active materials (e.g., the second PMOS active materials 818 and the second NMOS active materials 820) of the second set of SCRC switches 804. More specifically, the first PMOS active materials 814 are positioned between the power reception lines 808 and the second PMOS active materials 818 and the first NMOS active materials 816 are positioned between the power reception lines 808 and the second NMOS active materials 820.

The first set of SCRC switches 802, which are positioned closer to the power reception lines 808 than the second set of SCRC switches 804, may be activated during both a high-speed operational mode and a lower-speed operational mode. The second set of SCRC switches 804, which are positioned further from the power reception lines 808 than the first set of SCRC switches 802, may be activated during the high-speed operational mode, but may be deactivated during the lower-speed operational mode.

In some embodiments the second set of SCRC switches 804 may make up substantially 40% of the width of the SCRC switches in the one or more SCRC regions 826, similar to the second set of SCRC switches 704 of FIG. 7. Since the second set of SCRC switches 804 are spaced among the first set of SCRC switches 802, however, the power is distributed evenly to the power reception lines 808 across the electronic circuit 810 even when the second set of SCRC switches 804 is de-activated, in contrast to the apparatus 700 of FIG. 7. As a result, a maximum impedance between portions of the electronic circuit 810 and the power supply lines may be less (e.g., substantially 30% less) than that of the apparatus 700 when the second set of SCRC switches 804 is deactivated.

Figure 9:
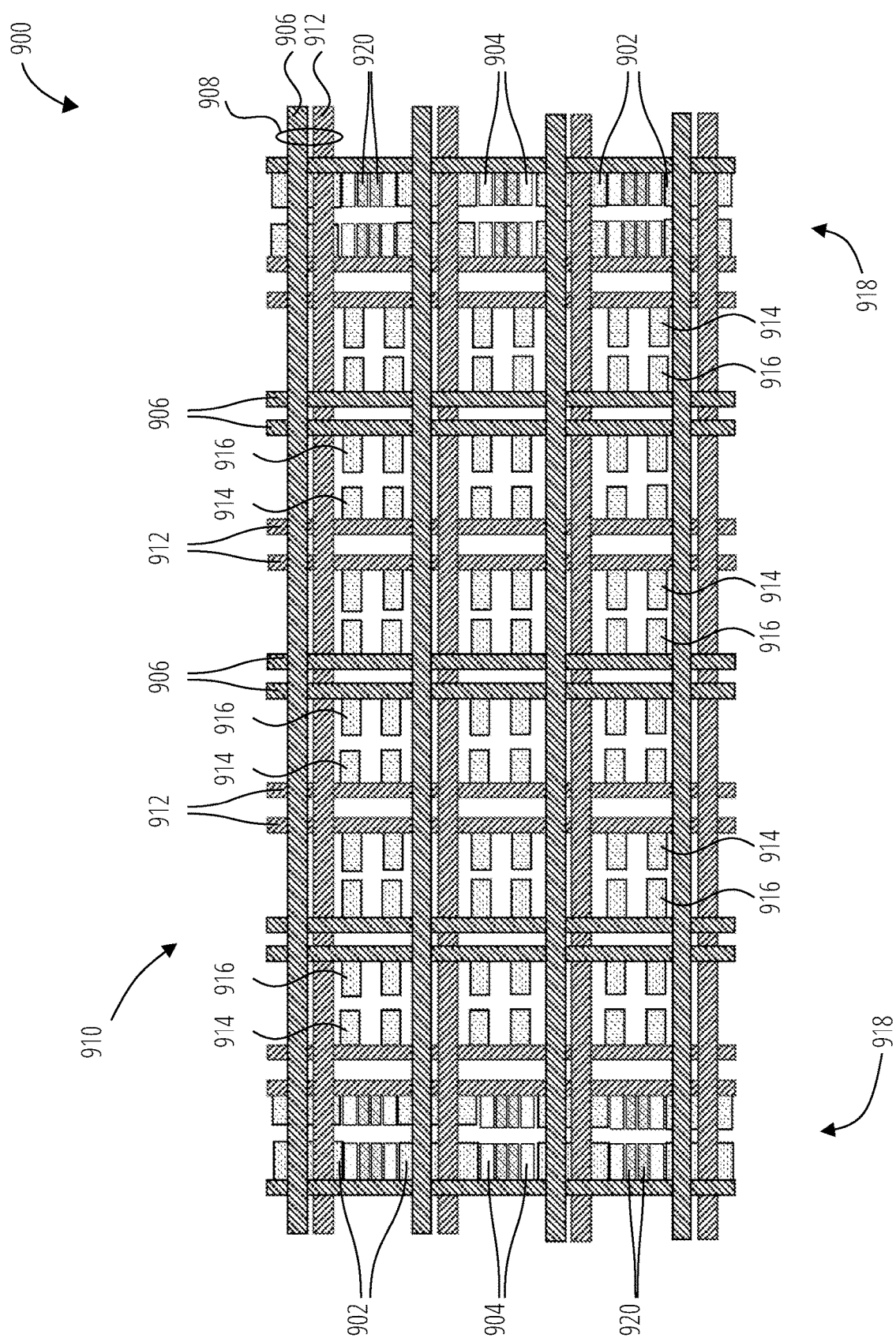
FIG. 9 is a plan view of yet another apparatus, according to some embodiments.

FIG. 9 is a plan view of yet another apparatus 900, according to some embodiments. The apparatus 900 is similar to the apparatus 800 of FIG. 8. For example, the apparatus 900 includes a first set of SCRC switches 902, a second set of SCRC switches 904, power reception lines 908, an electronic circuit 910, VPERIZ lines 906, VSSZ lines 912, PMOS active materials 916, NMOS active materials 914, and one or more SCRC regions 918 similar to the first set of SCRC switches 802, the second set of SCRC switches 804, the power reception lines 808, the electronic circuit 810, the VPERIZ lines 806, the VSSZ lines 812, the PMOS active materials 824, the NMOS active materials 822, and the one or more SCRC regions 826 of FIG. 8.

In contrast to the apparatus 800 of FIG. 8, however, the apparatus 900 also includes a third set of SCRC switches 920 electrically connected between the power supply lines (not shown) and the power reception lines 908. The third set of SCRC switches 920 is spaced among the first set of SCRC switches 902 and the second set of SCRC switches 904 at the one or more SCRC regions 918. Active materials of the first set of SCRC switches 902 and the second set of SCRC switches 904 may be positioned between active materials of the third set of SCRC switches 920 and the power reception lines 908. For example, the active materials of the first set of SCRC switches 902 may be positioned between the active materials of the second set of SCRC switches 904 and the active materials of the second set of SCRC switches 904 may be positioned between the active materials of the first set of SCRC switches 902 and the active materials of the third set of SCRC switches 920. With the active materials of the various sets of SCRC switches thus spaced, a relatively low resistance between the electronic circuit 910 and the power reception lines 908 may be expected regardless of which of the various sets of SCRC switches are activated and which are deactivated.

In some embodiments the electronic circuit 910 may be configured to operate in a first operational mode associated with a first speed of operation, a second operational mode associated with a second speed of operation, and a third operational mode associated with a third speed of operation. The first speed of operation may be faster than the third speed of operation and the third speed of operation may be faster than the second speed of operation. By way of non-limiting example, the first speed of operation may be 4.3 G operation, the third speed of operation may be 3.2 G operation, and the second speed of operation may be 1.6 G operation. The first set of SCRC switches 902 may be maintained activated during each of the first operational mode, the second operational mode, and the third operational mode. The second set of SCRC switches 904 may be maintained activated during each of the first operational mode and the third operational mode, but maintained deactivated during the second operational mode. The third set of SCRC switches 920 may be maintained activated during the first operational mode but maintained deactivated during the second operational mode and the third operational mode.

In general, the distance from which the different sets of SCRC switches are positioned relative to the power reception lines 908 may be based on the number of operational modes (e.g., corresponding to operational speeds) the sets of SCRC switches are activated for. The larger the number of operational modes a given set of SCRC switches is activated for the closer it should be positioned to the power reception lines 908. In this example, since the first set of SCRC switches 902 is activated in each of the first operational mode, the second operational mode, and the third operational mode, the first set of SCRC switches 902 is positioned closer to the power reception lines 908 than the second set of SCRC switches 904 and the third set of SCRC switches 920. Also, since the second set of SCRC switches 904 is activated in two of these three operational modes, the second set of SCRC switches 904 is positioned further from the power reception lines 908 than the first set of SCRC switches 902, but closer to the power reception lines 908 than the third set of SCRC switches 920, which are only activated for one of these operational modes. In some embodiments the distance of the various sets of SCRC switches from the power reception lines 908 may be ordered based on strict operating speed.

Figure 10:
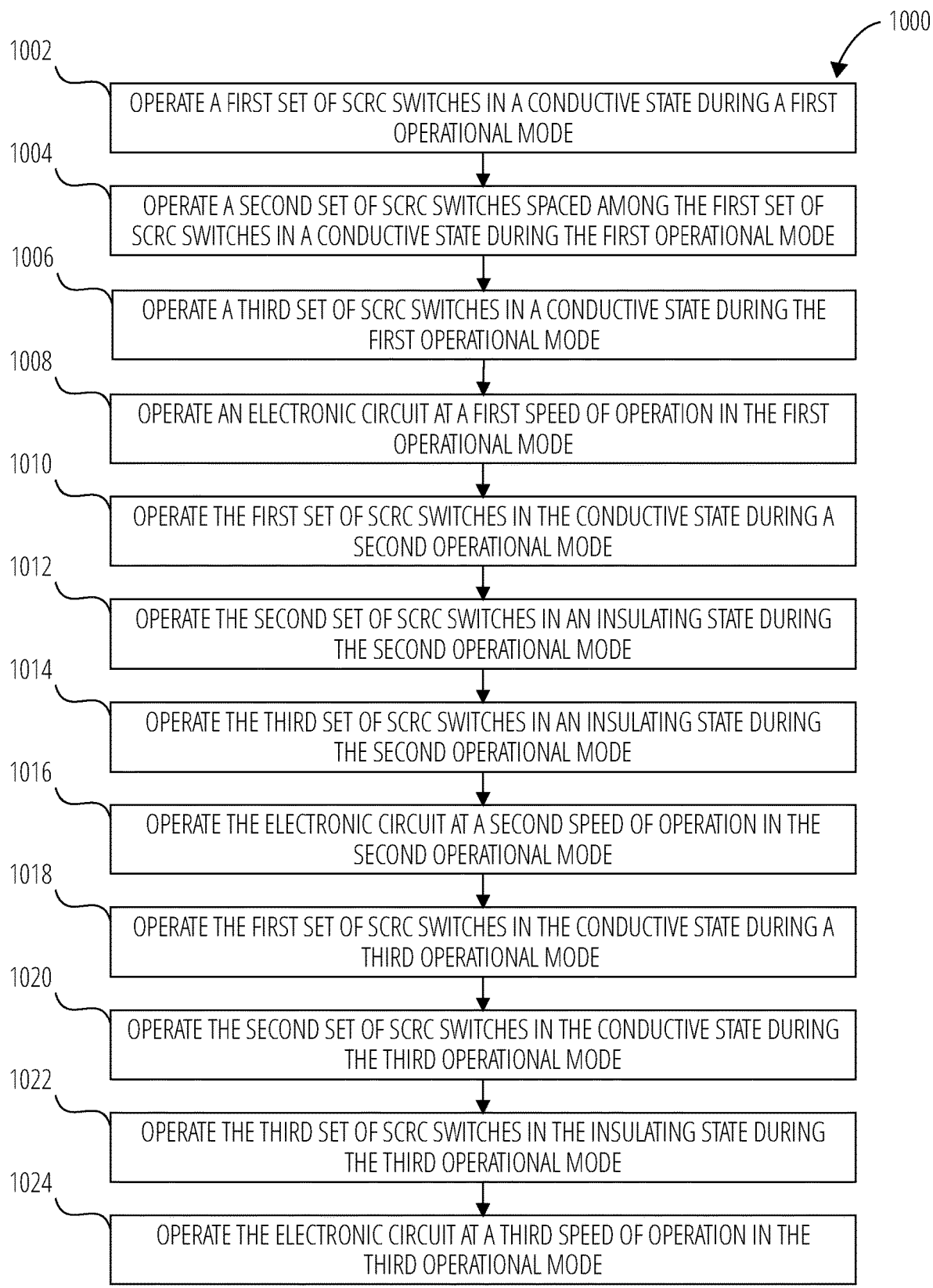
FIG. 10 is a flowchart illustrating a method of operating an electronic circuit, according to some embodiments.

FIG. 10 is a flowchart illustrating a method 1000 of operating an electronic circuit, according to some embodiments. In operation 1002 the method 1000 includes operating a first set of SCRC switches in a conductive state during a first operational mode of the electronic circuit to provide power to the electronic circuit through the first set of SCRC switches. In operation 1004 the method 1000 includes operating a second set of SCRC switches spaced among the first set of SCRC switches in a conductive state during the first operational mode to provide the power to the electronic circuit through the second set of SCRC switches. In operation 1006 the method 1000 includes operating a third set of SCRC switches spaced among the first set of SCRC switches and the second set of SCRC switches in a conductive state during the first operational mode to provide the power to the electronic circuit through the third set of SCRC switches. In operation 1008 the method 1000 includes operating the electronic circuit at a first speed of operation in the first operational mode.

In operation 1010 the method 1000 includes operating the first set of SCRC switches in the conductive state during a second operational mode of the electronic circuit to provide the power to the electronic circuit through the first set of SCRC switches. In operation 1012 the method 1000 includes operating the second set of SCRC switches in an insulating state during the second operational mode to electrically isolate the electronic circuit from the power through the second set of SCRC switches. In operation 1014 the method 1000 includes operating the third set of SCRC switches in an insulating state during the second operational mode to electrically isolate the electronic circuit from the power through the third set of SCRC switches. In operation 1016 the method 1000 includes operating the electronic circuit at a second speed of operation in the second operational mode. In some embodiments the second speed of operation is slower than the first speed of operation.

In operation 1018 the method 1000 includes operating the first set of SCRC switches in the conductive state during a third operational mode of the electronic circuit to provide the power to the electronic circuit through the first set of SCRC switches. In operation 1020 the method 1000 includes operating the second set of SCRC switches in the conductive state during the third operational mode to provide the power to the electronic circuit through the second set of SCRC switches. In operation 1022 the method 1000 includes operating the third set of SCRC switches in the insulating state during the third operational mode to electrically isolate the electronic circuit from the power through the third set of SCRC switches. In operation 1024 the method 1000 includes operating the electronic circuit at a third speed of operation in the third operational mode. In some embodiments the third speed of operation is faster than the second speed of operation but slower than the first speed of operation.

Figure 11:
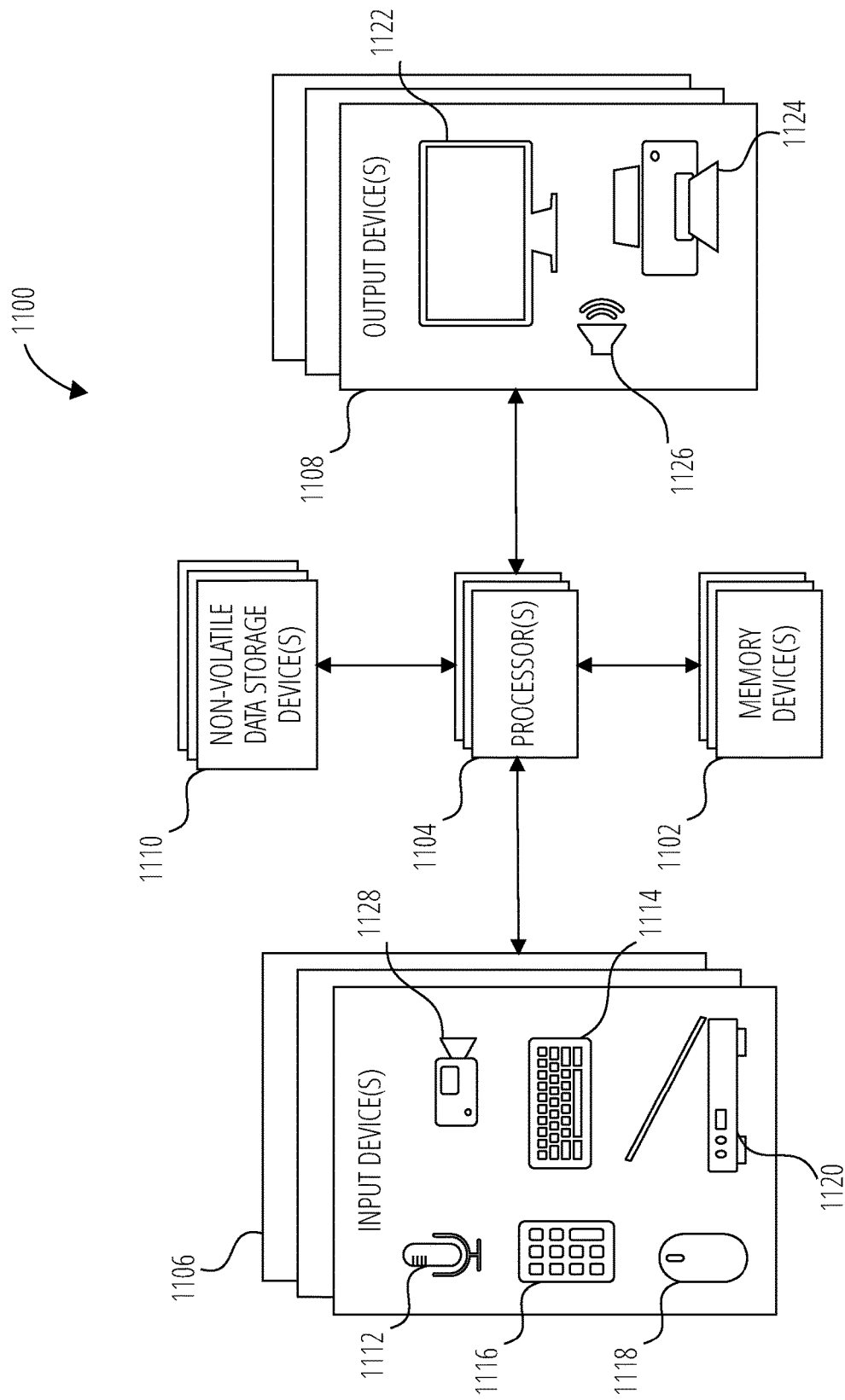
FIG. 11 is a block diagram of a computing system, according to some embodiments.

FIG. 11 is a block diagram of a computing system 1100, according to some embodiments. The computing system 1100 includes one or more processors 1104 operably coupled to one or more memory devices 1102, one or more non-volatile data storage devices 1110, one or more input devices 1106, and one or more output devices 1108. In some embodiments the computing system 1100 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 1104 may include a central processing unit (CPU) or other processor configured to control the computing system 1100. In some embodiments the one or more memory devices 1102 include random access memory (RAM), such as volatile data storage (e.g., dynamic RAM (DRAM) static RAM (SRAM), etc.). In some embodiments the one or more non-volatile data storage devices 1110 include a hard drive, a solid state drive, Flash memory, erasable programmable read only memory (EPROM), other non-volatile data storage devices, or any combination thereof. In some embodiments the one or more input devices 1106 include a keyboard 1114, a pointing device 1118 (e.g., a mouse, a track pad, etc.), a microphone 1112, a keypad 1116, a scanner 1120, a camera 1128, other input devices, or any combination thereof. In some embodiments the output devices 1108 include an electronic display 1122, a speaker 1126, a printer 1124, other output devices, or any combination thereof.

In some embodiments the one or more memory devices 1102 include the apparatus 100 of FIG. 1, the SCRC circuitry 200 of FIG. 2, the circuitry for a memory device 400 of FIG. 4, the apparatus 700 of FIG. 7, the apparatus 800 of FIG. 8, the apparatus 900 of FIG. 9, or combinations thereof. In some embodiments the one or more memory devices 1102 are configured to perform the method 500 of FIG. 5, the method 600 of FIG. 6, the method 1000 of FIG. 10, or combinations thereof. In some embodiments the one or more memory devices 1102 are configured to operate according to the signal timing diagram 300 discussed above with reference to FIG. 3.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
an electronic circuit comprising first circuitry and second circuitry;
a first set of sub-threshold current reduction circuit (SCRC) switches at one or more SCRC regions of an integrated circuit device including the electronic circuit, the first set of SCRC switches configured to provide power to the first circuitry; and
a second set of SCRC switches spaced among the first set of SCRC switches at the one or more SCRC regions, at least one second SCRC switch of the second set of SCRC switches positioned between one of the first set of SCRC switches and another of the first set of SCRC switches, the second set of SCRC switches configured to provide power to the second circuitry, the one or more SCRC regions separate from a region of the electronic circuit.

2. The apparatus of claim 1, wherein the electronic circuit is configured to:
operate according to a first operational mode, the first set of SCRC switches and the second set of SCRC switches activated to provide the power to the first circuitry and the second circuitry during the first operational mode; and
operate according to a second operational mode, the first set of SCRC switches activated to provide the power to the first circuitry during the second operational mode, the second set of SCRC switches deactivated to isolate the second circuitry from the power during the second operational mode.

3. The apparatus of claim 2, wherein the first operational mode is associated with a first speed of operation of the electronic circuit and the second operational mode is associated with a second speed of operation of the electronic circuit.

4. The apparatus of claim 3, further comprising a third set of SCRC switches spaced among the first set of SCRC switches and the second set of SCRC switches at the one or more SCRC regions, wherein the electronic circuit further comprises third circuitry, the third set of SCRC switches configured to provide power to the third circuitry.

5. The apparatus of claim 4, wherein the electronic circuit is configured to operate according to a third operational mode, the first set of SCRC switches and the second set of SCRC switches activated to provide the power to the first circuitry and the second circuitry during the third operational mode, the third set of SCRC switches deactivated to isolate the third circuitry from the power during the second operational mode and the third operational mode, the third set of SCRC switches activated to provide the power to the third circuitry during the first operational mode.

6. The apparatus of claim 5, wherein the third operational mode is associated with a third speed of operation of the electronic circuit, the first speed of operation faster than the second speed of operation, the second speed of operation faster than the third speed of operation.

7. An apparatus, comprising:
power supply lines;
power reception lines;
a first set of sub-threshold current reduction circuit (SCRC) switches electrically connected between the power supply lines and the power reception lines; and
a second set of SCRC switches electrically connected between the power supply lines and the power reception lines, the second set of SCRC switches spaced among the first set of SCRC switches at one or more SCRC regions of an integrated circuit device, at least one second SCRC switch of the second set of SCRC switches positioned between one of the first set of SCRC switches and another of the first set of SCRC switches, the one or more SCRC regions separate from a region of an electronic circuit, the electronic circuit configured to receive power through the first set of SCRC switches and the second set of SCRC switches.

8. The apparatus of claim 7, wherein the first set of SCRC switches and the second set of SCRC switches include metal-oxide-semiconductor (MOS) transistors including active materials, wherein the active materials of the first set of SCRC switches are positioned between the power reception lines and the active materials of the second set of SCRC switches.

9. The apparatus of claim 8, further comprising a third set of SCRC switches electrically connected between the power supply lines and the power reception lines, the active materials of the first set of SCRC switches and the second set of SCRC switches positioned between the power reception lines and active materials of the third set of SCRC switches.

10. The apparatus of claim 9, wherein:
during a first operational mode the first set of SCRC switches, the second set of SCRC switches, and the third set of SCRC switches are configured to electrically connect the power supply lines to the power reception lines;
during a second operational mode the first set of SCRC switches is configured to electrically connect the power supply lines to the power reception lines and the second set of SCRC switches and the third set of SCRC switches are configured to electrically isolate the power supply lines from the power reception lines; and
during a third operational mode the first set of SCRC switches and the second set of SCRC switches are configured to electrically connect the power supply lines to the power reception lines and the third set of SCRC switches is configured to electrically isolate the power supply lines from the power reception lines.

11. The apparatus of claim 10, wherein the first operational mode is associated with a first speed of operation, the second operational mode is associated with a second speed of operation, and the third operational mode is associated with a third speed of operation, the first speed of operation faster than the second speed of operation and the second speed of operation faster than the third speed of operation.

12. The apparatus of claim 8, wherein:
during a first operational mode the first set of SCRC switches and the second set of SCRC switches are configured to electrically connect the power supply lines to the power reception lines; and
during a second operational mode the first set of SCRC switches is configured to electrically connect the power supply lines to the power reception lines and the second set of SCRC switches is configured to electrically isolate the power supply lines from the power reception lines.

13. The apparatus of claim 12, wherein the first operational mode is associated with a first speed of operation and the second operational mode is associated with a second speed of operation.

14. The apparatus of claim 13, wherein the first speed of operation is faster than the second speed of operation.

15. The apparatus of claim 7, further comprising a third set of SCRC switches electrically connected between the power supply lines and the power reception lines, the third set of SCRC switches spaced among the first set of SCRC switches and the second set of SCRC switches.

16. A method comprising:
operating a first set of sub-threshold current reduction circuit (SCRC) switches in a conductive state during a first operational mode of an electronic circuit to provide power to the electronic circuit through the first set of SCRC switches, the first set of SCRC switches at one or more SCRC regions of an integrated circuit device;
operating a second set of SCRC switches spaced among the first set of SCRC switches in a conductive state during the first operational mode to provide the power to the electronic circuit through the second set of SCRC switches, the second set of SCRC switches at the one or more SCRC regions, at least one second SCRC switch of the second set of SCRC switches positioned between one of the first set of SCRC switches and another of the first set of SCRC switches, the one or more SCRC regions separate from a region of the electronic circuit;
operating the first set of SCRC switches in the conductive state during a second operational mode of the electronic circuit to provide the power to the electronic circuit through the first set of SCRC switches; and
operating the second set of SCRC switches in an insulating state during the second operational mode to electrically isolate the electronic circuit from the power through the second set of SCRC switches.

17. The method of claim 16, further comprising:
operating a third set of SCRC switches in a conductive state during the first operational mode to provide the power to the electronic circuit through the third set of SCRC switches; and
operating the third set of SCRC switches in an insulating state during the second operational mode to electrically isolate the electronic circuit from the power through the third set of SCRC switches.

18. The method of claim 17, further comprising:
operating the first set of SCRC switches in the conductive state during a third operational mode of the electronic circuit to provide the power to the electronic circuit through the first set of SCRC switches;
operating the second set of SCRC switches in the conductive state during the third operational mode to provide the power to the electronic circuit through the second set of SCRC switches; and
operating the third set of SCRC switches in the insulating state during the third operational mode to electrically isolate the electronic circuit from the power through the third set of SCRC switches.

19. The method of claim 16, wherein operating the second set of SCRC switches spaced among the first set of SCRC switches comprises operating the second set of SCRC switches spaced among the first set of SCRC switches with active materials of the first set of SCRC switches positioned between power reception lines and active materials of the second set of SCRC switches.

20. The method of claim 16, further comprising:
operating the electronic circuit at a first speed of operation in the first operational mode; and
operating the electronic circuit at a second speed of operation that is slower than the first speed of operation in the second operational mode.

* * * * *